United States Patent [19]
Saito et al.

[11] Patent Number: 5,681,424
[45] Date of Patent: Oct. 28, 1997

[54] PLASMA PROCESSING METHOD

[75] Inventors: Go Saito, Kudamatsu; Motohiko Yoshigai, Hikari; Kenji Fujimoto, Nagareyama, all of Japan

[73] Assignee: Hitachi, Ltd., Tokyo, Japan

[21] Appl. No.: 553,435

[22] PCT Filed: May 20, 1994

[86] PCT No.: PCT/JP94/00812

§ 371 Date: Feb. 20, 1996

§ 102(e) Date: Feb. 20, 1996

[87] PCT Pub. No.: WO94/28578

PCT Pub. Date: Dec. 8, 1994

[30] Foreign Application Priority Data

May 20, 1993 [JP] Japan ..................... 5-118156
May 20, 1993 [JP] Japan ..................... 5-118161

[51] Int. Cl.$^6$ .................. B08B 7/00; H01L 21/00
[52] U.S. Cl. .............. 156/643.1; 156/345; 216/69; 216/70; 134/1.1; 134/22.1
[58] Field of Search ............... 156/643.1; 134/1.1, 134/1.2, 1.3; 216/67, 69, 70

[56] References Cited

U.S. PATENT DOCUMENTS

| | | | |
|---|---|---|---|
| 5,310,453 | 5/1994 | Fukasawa et al. | 156/643.1 |
| 5,314,573 | 5/1994 | Higuchi et al. | 156/643.1 |
| 5,318,665 | 6/1994 | Oikawa | 156/643.1 |
| 5,356,478 | 10/1994 | Chen et al. | 134/1 |
| 5,368,684 | 11/1994 | Ishikawa et al. | 156/643.1 |
| 5,401,356 | 3/1995 | Enami et al. | 156/643.1 |

Primary Examiner—R. Bruce Breneman
Assistant Examiner—Michael E. Adjodha
Attorney, Agent, or Firm—Antonelli, Terry, Stout & Kraus, LLP.

[57] ABSTRACT

A method of cleaning an etching chamber, with a high throughput, of a plasma processing apparatus for etching by use of hydrogen bromide (HBr) as an etching gas while holding a wafer on an electrode by electrostatic chuck. When the static charge on the wafer electrostatically chucked on the electrode is eliminated after the completion of the etching, $O_2$ gas is introduced into the etching chamber from a gas flow-rate controller. A plasma of $O_2$ gas is generated to cause the electric charge on the wafer to flow to the earth through the plasma, and at the same time, the interior of the etching chamber is cleaned.

21 Claims, 4 Drawing Sheets

PLASMA PROCESSING METHOD

BACKGROUND OF THE INVENTION

The present invention relates to a plasma processing method, and more particularly, it relates to a plasma processing method which is suitable for etching a wafer while holding the same on an electrode by electrostatic force, and using hydrogen bromide (HBr) as an etching gas.

As for the prior art etching process which utilizes hydrogen bromide (HBr), for example, as disclosed in the 53rd Applied Physics Society' Conference Preprint No. 16a-SK-7, it is known that when a polysilicon film provided with a resist mask is etched using HBr gas, a reaction product tends to deposit inside its reaction chamber. Therefore, conventionally, in order to remove the deposited products inside the chamber, a gas containing either one of sulfur hexafluoride ($SF_6$), nitrogen trifluoride ($NF_3$), freon 14 ($CF_4$) and freon 23 ($CHF_3$), or a mixture gas containing either one of the above and oxygen ($O_2$) has been used to produce a plasma which is used for plasma cleaning of the interior of the chamber.

The above-mentioned prior art, however, has not taken into account a plasma processing time or through-put. Namely, when the cleaning of the chamber is conducted in a conventional method using a fluoride gas or its mixture with $O_2$ gas, there was a problem that when the cleaning is carried out with an etch-processed wafer as mounted on the electrode, an adverse effect is caused on a machined shape of the etched wafer, or that when the cleaning is carried out without mounting the wafer on the electrode, there was another problem that the electrode is damaged by etching. Therefore, it was necessary to mount a dummy wafer on the electrode for protection. Thereby, since it was necessary to mount a dummy wafer for every wafer during every cycle of cleaning of the reaction products, it took a substantial time for exchanging the wafer and the dummy, thereby lowering the through-put of the production. In addition, when the electrostatic attractive force is utilized for holding the wafer on the electrode, since it was necessary to carry out a deelectrifying sequence to remove the electric charge on the wafer every time the wafer is exchanged, additional time is required.

SUMMARY OF THE INVENTION

An object of the present invention is to provide a plasma processing method which is capable of carrying out a cleaning with a high throughput without causing any adverse effect on the product.

Another object of the invention is to provide a plasma processing method for plasma-processing of a film of a Si-containing material, which can substantially reduce its etching process time as well as its post processing.

According to one aspect of the present invention, in the plasma processing method which carries out the etching process of the wafer while the same is held on the electrode by electrostatic chuck, residual electrostatic attraction force remaining on the wafer after the completion of the etching is caused to be discharged into a gas plasma of $O_2$ gas.

In accordance with another aspect of the present invention, the film made of Si-containing material after the same having been etched using a plasma of a bromine-containing gas is subjected to a post-processing using a plasma of a mixture gas containing $O_2$ and $CHF_3$ continuously in vacuum.

In the case of a plasma processing by use of HBr as an etching gas, a polymeride between carbon (C) which is a main component of a photoresist mask material to mask a material to be etched and hydrogen (H) present in HBr gas is caused to deposit inside the etching chamber. Therefore, after completion of etching of the wafer having the same wafer as electrostatically chucked on the electrode, $O_2$ gas instead of the etching gas is introduced into the chamber to generate a plasma of $O_2$ gas. Thereby, not only the residual electric charge on the wafer resulting from the electrostatic attraction can be deelectrified, but also cleaning of the interior of the chamber can be conducted at the same time by causing C and H which are the main components of the reaction product deposited inside the chamber to react with $O_2$ and to be removed. Thereby, an effective cleaning of the chamber without causing any adverse effect on the product and with a high throughput can be performed.

Since the film of Si-containing material after having been etched using the plasma of bromine-containing gas is subjected to the post processing using the plasma of the mixture gas containing $O_2$ and $CHF_3$ continuously in vacuum, deposits on the photo-resist and the side wall of the photo-resist can be removed, and in addition, a residual film of Si-containing material at the corner of the step-wise structure which has been left unetched can be removed also as a reaction product SiFx. Thereby, the time required for the over-etching can be eliminated, thereby the overall processing time can be minimized according to the invention.

DESCRIPTION OF THE PREFERRED EMBODIMENTS

Now, with reference to FIGS. 1 and 2, an embodiment of the invention will be described.

Figure 1:
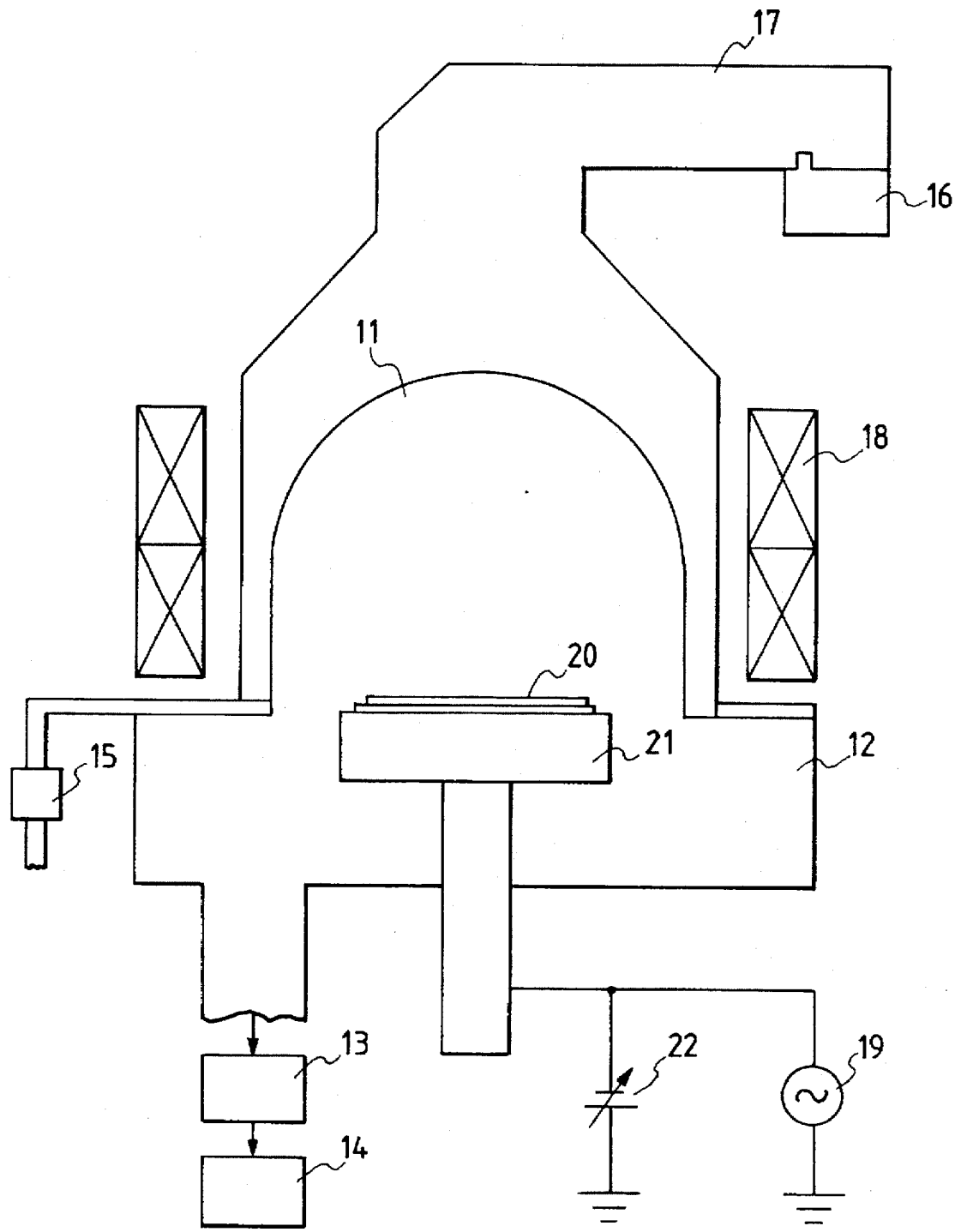
FIG. 1 is a block diagram of an embodiment of the plasma processing method according to the present invention.
Figure 2:
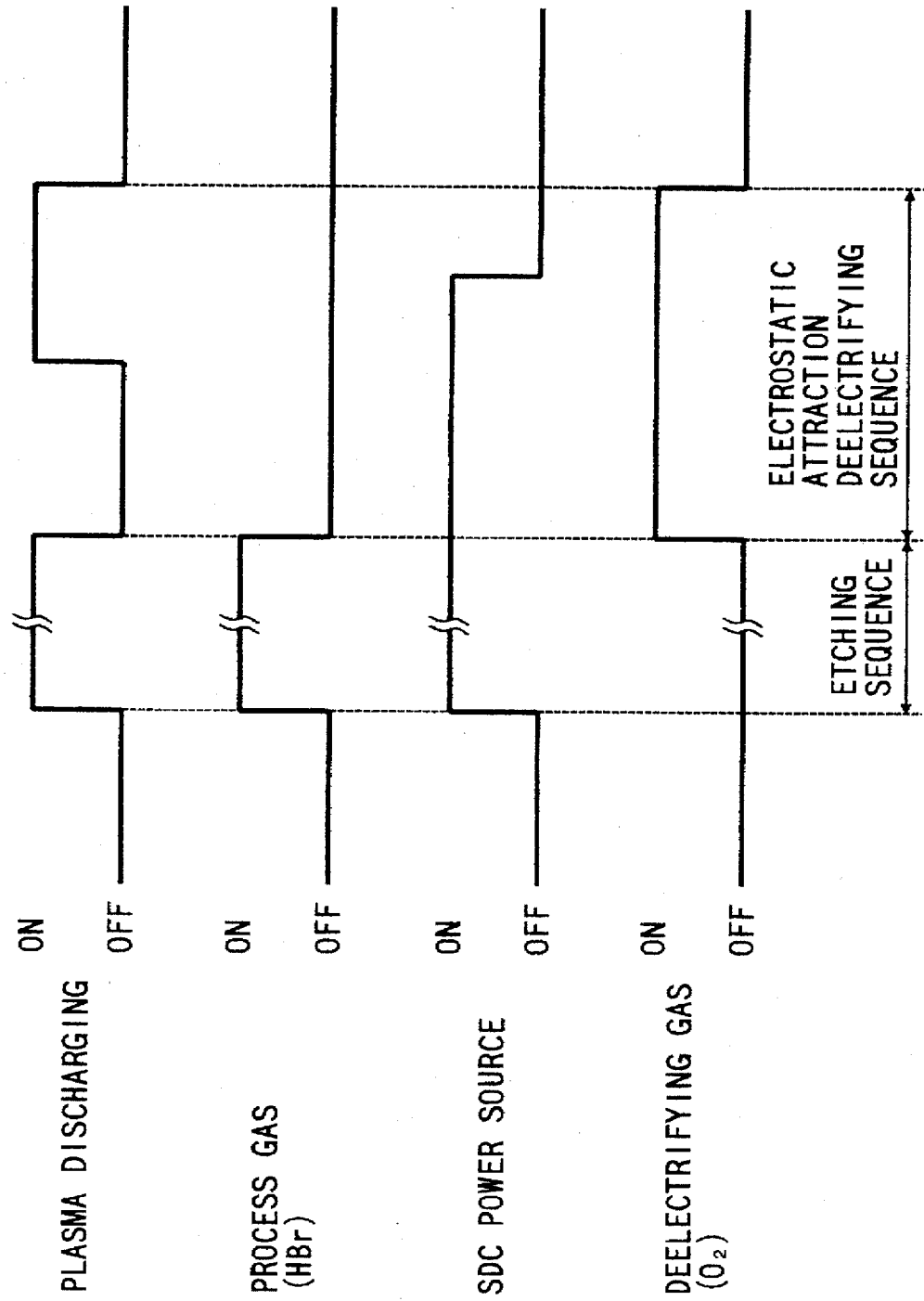
FIG. 2 is a timing chart illustrating the operation of the embodiment of the present invention.

A microwave plasma etching apparatus of an embodiment of a plasma processing apparatus for implementing the invention is shown in FIG. 1. Vacuum chamber 12 to which etching chamber 11 is hermetically connected is evacuated to a high vacuum in advance by an exhaust system including high vacuum pump 13 and auxiliary pump 14. Then, an etching gas is introduced into the etching chamber 11 through flow-rate controller 15. When the inside of the vacuum chamber 12 is maintained at a preset gas pressure, a microwave oscillated by magnetron 16 is introduced through waveguide 17 into the etching chamber 11, where, through an interaction between the microwave and a magnetic field formed by field coil 18, a plasma is produced in a discharge portion within the etching chamber 11. Then, by means of high frequency power supply 19 which is connected to electrode 21 on which wafer 20 is mounted, ions in the plasma are drawn to the wafer 20 where the drawn active ions react with the surface of the wafer 20 to be processed thereby etching the same. Further, by means of electrostatic attraction power supply 22 connected to the electrode 21, electrostatic attraction is induced between the wafer 20 and the electrode 21 to improve adhesion between the wafer 20 and the electrode 21 and enhance cooling efficiency. Further, in order to eliminate a residual electrostatic attraction remaining on the wafer 20 for facilitating transfer of the wafer 20 after completion of the etching process therefor, a plasma is generated inside the etching chamber 11 to allow the electric charge on the wafer to be discharged into the plasma (which process is referred to as a deelectrifying sequence). In the foregoing arrangement of apparatus, HBr is supplied as an etching gas into the etching chamber 11 through gas flow-rate controller 15 as shown in FIG. 2 until a predetermined gas pressure is obtained, then a plasma is generated in the etching chamber 11 through oscillation of a microwave by means of the magnetron 16. At this instant, a magnetic field is already formed therein by the field coil 18. When the plasma is generated, the etching process for the wafer is started, and at the same time, the wafer 20 on the electrode 21 is electrostatically chucked by the electrostatic attraction power supply 22 to allow proceed the etching process as chucked. Through this etching process, carbon (C) which is the main component of the photoresist mask material for masking the material to be etched and hydrogen (H) present in HBr gas are caused to form a polymeride which deposits on the inner surface of the etching chamber 11.

After completion of the etching of wafer 20, having the same wafer still electrostatically chucked on the electrode 21, $O_2$ gas instead of the etching process gas is supplied into the etching chamber 11 to generate a plasma of the $O_2$ gas therein. Through this plasma generated therein, the residual electric charge on the wafer 20 is allowed to flow to the earth, thereby eliminating or deelectrifying the charge on the wafer 20 according to the invention. Further, through generation of $O_2$ plasma, C and H which are the main components of the reaction product deposited inside the chamber are caused to react with O to form $COx$, $H_2O$ which can be easily removed from the chamber thus completing the cleaning thereof. Thereby, an efficient cleaning of the chamber with an improved throughput and minimizing of the adverse effect on the product as experienced conventionally can be realized according to the invention.

According to this embodiment of the invention, it is possible to carry out cleaning of the chamber after etching of every wafer by use of the deelectrifying sequence of the invention so that the next etching process for the next wafer is always ready to be executed in the etching chamber 11 which is maintained always clean. However, in the case where no electrostatic attraction is utilized, by adding a cleaning step to the etching step, it becomes possible also to carry out the next etching process for the next wafer since thereby the interior of the etching chamber 11 can be maintained clean.

Another embodiment of the invention will be described in the following with reference to FIGS. 3 to 6.

Figure 3:
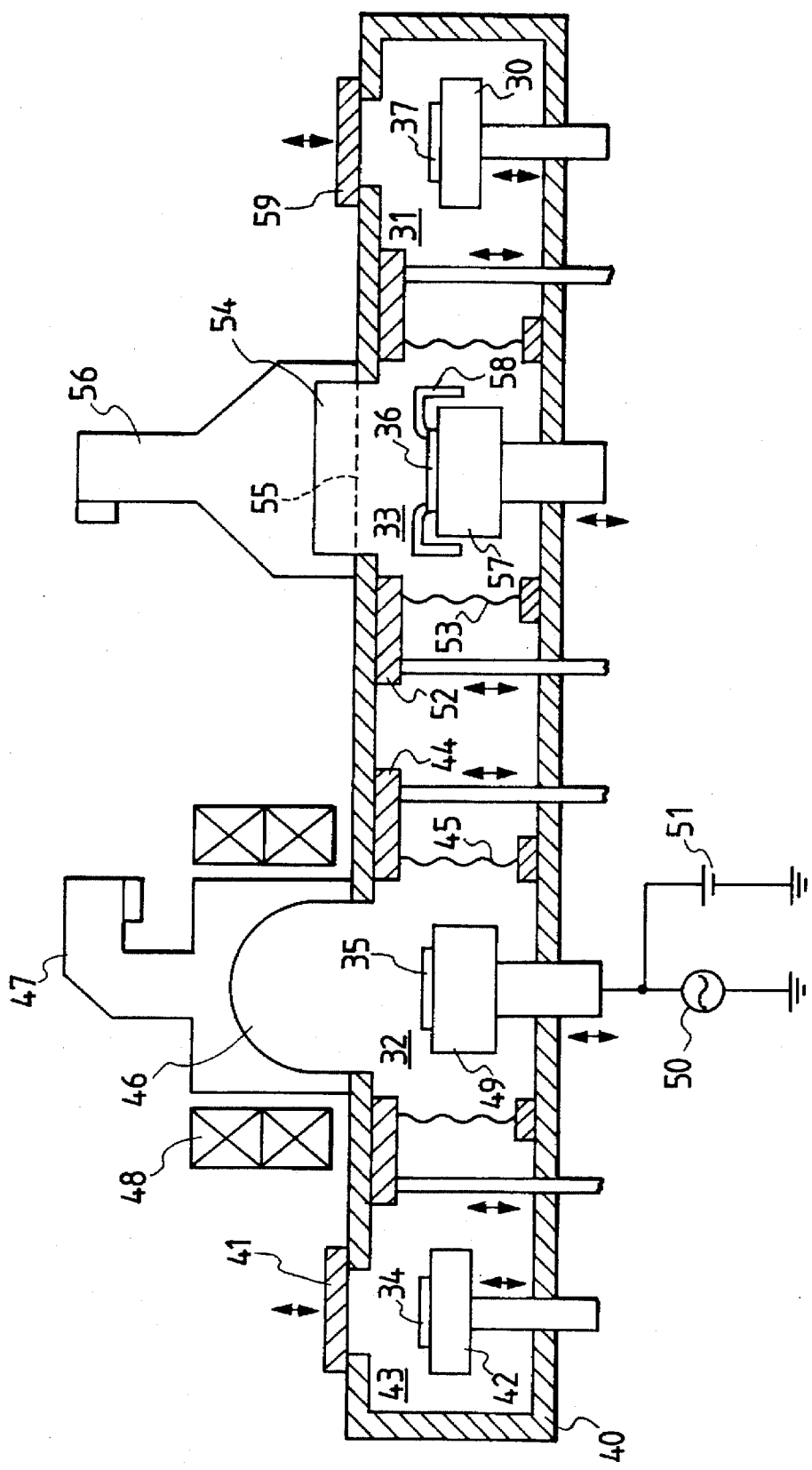
FIG. 3 is a block diagram of another embodiment of the plasma processing method according to the present invention FIG. 4 indicates each state of etching during the etching process according to the plasma processing method of the invention.

With reference to FIG. 3, an example of a schematic arrangement of apparatus for implementing the invention is shown. This exemplary apparatus is comprised of an etching chamber which utilizes the in-magnetic field microwave plasma technique, and a post-processing chamber which is coupled to the etching chamber via a vacuum space and utilizes the down-flow microwave plasma technique. In the drawing, vacuum chamber 40 includes load lock chamber 43 comprised of loading cover 41 and loading stage 42, etching chamber 32 comprised of bell jar 46 and bellows 45 integral with partition 44, post processing chamber 33 comprised of bell jar 54 and bellows 53 integral with partition 52, and unload lock chamber 31 comprised of unloading cover 59 and unloading stage 30, further, there are provided workpiece stage electrode 49 in the etching chamber 32 and workpiece stage 57 in the post processing chamber 53.

More specifically, the etching chamber is comprised of bell jar 46, waveguide 47 and coil 48 provided to surround the bell jar 46, workpiece stage electrode 49, and high frequency power supply 50 and DC power supply 51 for electrostatic attraction, both power supplies being connected to the workpiece stage electrode 49. The DC power supply 51 is used for holding wafer 35 disposed on the workpiece stage electrode 49 by electrostatic attraction or chuck. The waveguide 47 is provided with a magnetron for oscillating a microwave at its other end.

More specifically, the post processing chamber is comprised of bell jar 54, waveguide 56 provided to surround the bell jar 54, workpiece stage 57 and pressure bar 58 for holding wafer 36 disposed on the workpiece stage 57. The waveguide 56 is provided with a magnetron for oscillating a microwave at the other end thereof. Inside the bell jar 54 there is provided a punched metal 55 which allows only radicals in the plasma to pass therethrough.

In the apparatus having the aforementioned arrangements, each of the loading cover 41, loading stage 42, partition plates 44 and 52, unloading cover 59, and unloading stage 30 can be lifted, and they constitute the load lock chamber 43, etching chamber 32, post processing chamber 33 and unloading chamber 31. The wafer is transferred by a transfer machine (not shown) in the order from the load lock chamber 43, etching chamber 32, post processing chamber 33, and to the unload lock chamber 31 during the etching and post processing.

Figure 4A:
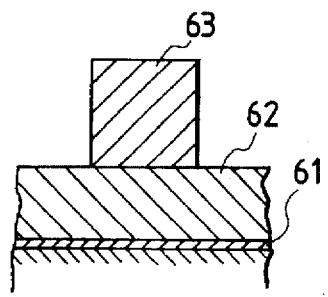
Figure 4B:
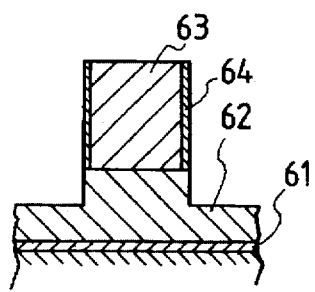
Figure 4C:
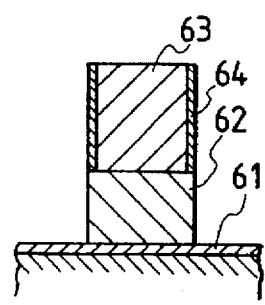

In the etching chamber 32, etching process is conducted using a mixture gas of HBr of 120 sccm and $O_2$ of 4 sccm as an etching gas, at pressure of 0.01 Torr, microwave power of 0.7 KW, high frequency power of 25 W, and wafer temperature of 20° C. Accordingly, etching process as indicated in FIGS. 4(a) to (c) proceeds. FIG. 4(a) indicates a state before etching where poly-silicon 62 is laminated on a silicon substrate via oxide film 61, and further, photo resist 63 is formed thereon as a mask. FIG. 4(b) indicates a state under progress of etching where the poly-silicon 62 is caused to react with activated particles in the plasma to produce a reaction product SiBrx which is to be removed. In this instance, a part of the reaction product SiBrx is attached to the side surface of the resist as a deposit. FIG. 4(c) indicates a state when etching of the poly-silicon is completed. By way of example, addition of $O_2$ to the etching gas will suppress an etching speed for the oxide film 61.

Figure 5:
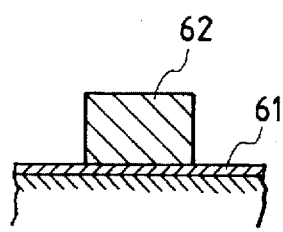
FIG. 5 indicates a post-ashing state in the post-processing step according to the plasma processing method of the invention.

In the next step, an ashing process is conducted in the post processing chamber 33 using as an ashing gas a mixture gas of $O_2$ 300 sccm and $CHF_3$ 15 sccm, at pressure 0.7 Torr, microwave power 1000 W, and wafer temperature 25° C. Thereby, as shown in FIG. 5, the resist is removed leaving only the unetched poly-silicon 62. By this time, the photo resist which was caused to react with radicals of oxygen which have passed through the punched metal 55 is removed as a reaction product CO. Further, the deposit SiBrx attached to the side wall of the photo resist is likewise caused to react with radicals of bromine to be removed as SiFx or the like, thereby accomplishing an effective ashing process without leaving any residual deposits thereafter.

Figure 6:
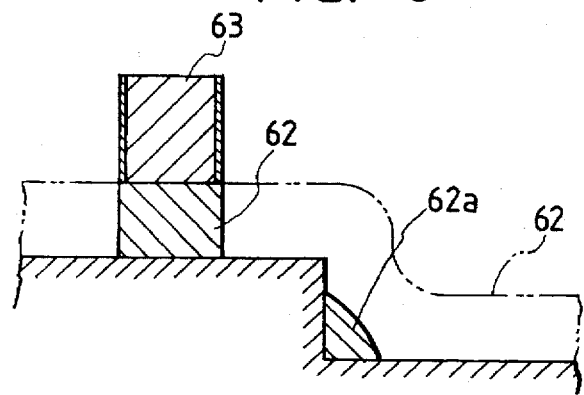
FIG. 6 indicates a post-etching state in the etching step of an exemplary workpiece having a stepwise structure to which the plasma processing method of the invention is to be applied.

Further, even when a surface to be etched has a step structure as indicated in FIG. 6, the prior art over-etching process to remove residual poly-silicon 62a remaining at the corner of the step after the etching process can be omitted, since the residual poly-silicon 62a is caused to react with bromine radicals in the subsequent post processing easily to be removed in the form of SiFx, thereby reducing the etching process time by eliminating the overetching time.

Still further, to be noted in particular in the operation of this apparatus is that during the etching process in the etching chamber 32, wafer 35 is held on the workpiece stage electrode 49 through electrostatic attraction or electrostatic chuck, and that in order to remove the wafer 35 from the workpiece stage electrode 49 after the etching is completed and DC power source 51 for the electrostatic chuck is turned off, $O_2$ plasma is generated in the etching chamber 32 to cause a plasma discharge to take place so that the electric charge on the wafer 35 is deelectrified therethrough. The use of $O_2$ plasma for deelectrifying the electric charge on the wafer 35 also ensures cleaning of the interior of the etching chamber every sheet of wafers without adding an extra cleaning process, thereby, no ageing in the process performance occurs even if the etching process is continued, thus minimizing the routine cleaning operation, and thereby substantially improving availability factor of the apparatus. Further, since the wafer 35 having been subjected to the etching process is exposed to $O_2$ plasma, which in effect involves ashing action, therefore, an ashing process time in the post processing chamber 33 can be reduced, thereby the overall throughput can be improved substantially. According to our experiments, it took 100 sec for the ashing process time when $O_2$ plasma was not applied in the deelectrifying sequence, namely, when He was used. However, when the wafer was exposed to $O_2$ plasma for 15 sec in the deelectrifying sequence, the subsequent ashing process time has been decreased to 60 sec, achieving a time reduction of 25 sec in total.

The film of Si-containing material used in this embodiment of the invention has been described by way of example of poly-silicon, however, it is not limited thereto, and tungsten silicide (WSix) or a laminate structure of tungsten silicide and poly-silicon (WSix/Poly-Si) may be used to the same effect.

Further, in this embodiment of the invention, the plasma of the mixture gas of the bromine-containing gas HBr and $O_2$ was used for etching of the film of Si-containing material, but it is not limited thereto, and a chlorine containing gas may also be used as the etching gas.

Still further, the etching equipment and the post-processing equipment of the invention were described by way of example of the apparatus which uses microwaves, but it is not limited thereto, and any equipment that can carry out the same processing may be utilized.

We claim:

1. A plasma processing method for performing an etching process on a wafer while holding the wafer on an electrode in a chamber by electrostatic attraction, the etching process causing deposition of a polymer including carbon in the chamber, wherein after the wafer has been etched, the method includes a further step of eliminating a residual electrostatic attractive force remaining on said wafer after completion of said etching process through use of a gas plasma of $O_2$ gas to deelectrify residual electric charge on said wafer by discharging into said plasma, and wherein said polymer is eliminated through said use of the gas plasma of $O_2$ gas, to clean the chamber.

2. The plasma processing method according to claim 1, wherein said etching process uses hydrogen bromide as an etching gas.

3. The plasma processing method according to claim 2, wherein the wafer has a resist film thereon during the etching process.

4. The plasma processing method according to claim 1, wherein the residual electrostatic attractive force remaining on the wafer and said polymer in the chamber are eliminated at a same time through use of the gas plasma of $O_2$ gas.

5. The plasma processing method according to claim 1, wherein a plurality of the wafers are etched in sequence, and wherein the gas plasma of $O_2$ gas is used to deelectrify residual electric charge on said wafer and to eliminate said polymer after etching each wafer.

6. The plasma processing method according to claim 1, wherein the wafer has a resist film thereon during the etching process.

7. The plasma processing method according to claim 1, wherein the wafer includes a silicon-containing film, said silicon-containing film being etched during said etching process.

8. A plasma processing method for performing an etching process on a wafer having a film of a silicon-containing material, to etch the film, while holding the wafer on an electrode in a chamber by electrostatic attraction, wherein after the etching process has been performed using a plasma of a bromine-containing gas, the method includes a further step of post-processing said film of the silicon-containing material using a plasma of a mixture gas containing $O_2$ and $CHF_3$ continuously in vacuum after said film has been etched.

9. The plasma processing method according to claim 3, wherein said bromine-containing gas is a mixture gas of HBr and $O_2$.

10. The plasma processing method according to claim 3, wherein said film of the silicon-containing material is a poly-silicon material.

11. The plasma processing method according to claim 3, wherein said film of the silicon-containing material is formed to have a step-wise structure.

12. The plasma processing method according to claim 3, wherein a surface of the wafer to be etched has a step structure, and any residual material to be etched in a corner of the step structure is removed during the post-processing.

13. A plasma processing method for performing an etching process on a wafer having a film of a silicon-containing material, to etch the film, while holding the wafer on an electrode in a chamber by electrostatic attraction, wherein after the etching process has been performed using a plasma of a chlorine-containing gas, the method includes a further step of post-processing said film of the silicon-containing material using a plasma of a mixture gas containing $O_2$ and $CHF_3$ continuously in vacuum after said film has been etched.

14. The plasma processing method according to claim 7, wherein said film of the silicon-containing material is a poly-silicon material.

15. The plasma processing method according to claim 7, wherein said film of the silicon-containing material is formed to have a step-wise structure.

16. The plasma processing method according to claim 7, wherein a surface of the wafer to be etched has a step structure, and any residual material to be etched in a corner of the step structure is removed during the post-processing.

17. A plasma processing method comprising the steps of:

performing an etching process on a wafer in a chamber, which causes the deposition of a polymer including carbon components in the chamber; and producing a plasma of $O_2$ gas in the chamber, and eliminating the polymer deposited in the chamber by reacting with the plasma of $O_2$ gas.

18. The plasma processing method according to claim 17, wherein the wafer has a resist film thereon.

19. The plasma processing method according to claim 18, wherein said etching process is performed using hydrogen bromide as an etching gas.

20. The plasma processing method according to claim 17, wherein said etching process is a plasma etching process.

21. The plasma processing method according to claim 17, wherein said wafer remains in said chamber during said producing the plasma of $O_2$ gas and eliminating the polymer deposited in the chamber.

* * * * *